United States Patent
You et al.

(10) Patent No.: US 6,998,148 B1
(45) Date of Patent: Feb. 14, 2006

(54) POROUS MATERIALS

(75) Inventors: Yujian You, Lansdale, PA (US); Nikoi Annan, Willow Grove, PA (US); Michael K. Gallagher, Hopkinton, MA (US); Robert H. Gore, Southampton, PA (US)

(73) Assignee: Shipley Company, L.L.C., Marlborough, MA (US)

( * ) Notice: Subject to any disclaimer, the term of this patent is extended or adjusted under 35 U.S.C. 154(b) by 611 days.

(21) Appl. No.: 10/106,338

(22) Filed: Mar. 26, 2002

Related U.S. Application Data

(60) Provisional application No. 60/279,541, filed on Mar. 28, 2001.

(51) Int. Cl.
*B05D 5/12* (2006.01)
*H01L 21/4763* (2006.01)

(52) U.S. Cl. .................... 427/96.1; 427/99.2; 427/99.3; 427/99.4; 427/99.5; 427/372.2; 427/379; 427/384; 438/619; 438/623; 438/624

(58) Field of Classification Search .......... 427/96.1, 427/99.2, 99.3, 99.4, 99.5, 379, 372.2, 372.3, 427/384; 521/61, 77, 96; 438/623, 624, 619
See application file for complete search history.

(56) References Cited

U.S. PATENT DOCUMENTS

| | | | |
|---|---|---|---|
| 5,384,376 A | | 1/1995 | Tunney et al. |
| 5,700,844 A | | 12/1997 | Hedrick et al. |
| 5,726,211 A | | 3/1998 | Hedrick et al. |
| 5,756,021 A | | 5/1998 | Hedrick et al. |
| 5,776,990 A | * | 7/1998 | Hedrick et al. ............ 521/77 |
| 5,804,607 A | | 9/1998 | Hedrick et al. |
| 5,895,263 A | * | 4/1999 | Carter et al. ............ 438/624 |
| 6,093,636 A | * | 7/2000 | Carter et al. ............ 438/623 |
| 6,107,357 A | * | 8/2000 | Hawker et al. ............ 521/77 |
| 6,146,749 A | | 11/2000 | Miyamoto et al. |
| 6,162,838 A | * | 12/2000 | Kohl ................. 521/77 |
| 6,214,748 B1 | | 4/2001 | Kobayashi et al. |
| 6,271,273 B1 | * | 8/2001 | You et al. ............... 521/61 |
| 6,391,932 B1 | | 5/2002 | Gore et al. |
| 6,420,441 B1 | * | 7/2002 | Allen et al. ............ 521/77 |
| 6,528,426 B1 | | 3/2003 | Olsen et al. |
| 6,566,243 B1 | | 5/2003 | Gaynor |
| 6,589,865 B1 | | 7/2003 | Dixit et al. |
| 6,596,467 B1 | | 7/2003 | Gallagher et al. |
| 6,602,804 B1 | | 8/2003 | Allen et al. |
| 6,630,520 B1 | | 10/2003 | Bruza et al. |
| 6,653,358 B1 | * | 11/2003 | Bruza et al. ............ 521/77 |
| 6,667,147 B1 | | 12/2003 | Gallagher et al. |
| 2002/0173587 A1 | | 11/2002 | Blankenship et al. |
| 2003/0008989 A1 | | 1/2003 | You et al. |
| 2003/0186168 A1 | | 10/2003 | Gallagher et al. |
| 2003/0186169 A1 | | 10/2003 | Gallagher et al. |

FOREIGN PATENT DOCUMENTS

| | | |
|---|---|---|
| EP | 0 838 853 A2 | 4/1998 |
| EP | 0 997 497 A1 | 5/2000 |
| EP | 1 035 183 A1 | 9/2000 |
| EP | 1 051 061 A1 | 11/2000 |
| EP | 1 088 848 A1 | 4/2001 |
| JP | 354012500 A | 1/1979 |
| JP | 6013792 A | 7/1985 |
| JP | 99217458 A | 8/1999 |

OTHER PUBLICATIONS

Hedrick et al., "High Tg Polyimide Nanofoams Derived from Pyromellitic Dianhydride and 1,1–Bis(4–aminophenyl)–1–phenyl–2,2,2–trifluoroethane"; Journal of Polymer Science Part V; Polymer Chemistry vol. 34; pp. 2867–2877; (1996).

Srinivasan et al.; "Preparation of Thermally Labile PMMA Particles by Combined Non–Aqueous Dispersion Polymerization and Polymer Chain Transfer"; POLYMER vol. 39 Nos. 6–7, pp. 1497–1501; (1998).

Trollsas et al.; "Hyperbranched Poly($\in$–caprolactone)s"; Macromolecules, vol. 31, No. 11; pp. 3439–3445 (1998).

* cited by examiner

*Primary Examiner*—Brian K. Talbot
(74) *Attorney, Agent, or Firm*—S. Matthew Cairns

(57) ABSTRACT

Porous thermoset dielectric materials having low dielectric constants useful in electronic component manufacture are provided along with methods of preparing the porous thermoset dielectric materials. Also provided are methods of forming integrated circuits containing such porous thermoset dielectric material.

8 Claims, No Drawings

POROUS MATERIALS

This application claims the benefit of Provisional Application Ser. No. 60/279,541, filed on Mar. 28, 2001.

BACKGROUND OF THE INVENTION

This invention relates generally to porous materials. In particular, this invention relates to the preparation and use of porous films containing thermoset materials and having a low dielectric constant.

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer, or intermetal, insulating material used in the components. A method for reducing the dielectric constant of such interlayer, or intermetal, insulating material is to incorporate within the insulating film very small, uniformly dispersed pores or voids.

Porous dielectric matrix materials are well known in the art. One known process of making a porous dielectric involves co-polymerizing a thermally labile monomer with a dielectric monomer to form a block copolymer, followed by heating to decompose the thermally labile monomer unit. See, for example, U.S. Pat. No. 5,776,990. In this approach, the amount of the thermally labile monomer unit is limited to amounts less than about 30% by volume. If more than about 30% by volume of the thermally labile monomer is used, the resulting dielectric material has cylindrical or lamellar domains, instead of pores or voids, which lead to interconnected or collapsed structures upon removal, i.e., heating to degrade the thermally labile monomer unit. See, for example, Carter et. al., *Polyimide Nanofoams from Phase-Separated Block Copolymers, Electrochemical Society Proceedings* volume 97–8, pages 32–43 (1997). Thus, the block copolymer approach provides only a limited reduction in the dielectric constant of the matrix material.

Another known process for preparing porous dielectric materials disperses thermally removable particles in a dielectric precursor, polymerizing the dielectric precursor without substantially removing the particles, followed by heating to substantially remove the particles, and, if needed, completing the curing of the dielectric material. See, for example, U.S. Pat. No. 5,700,844. In the '844 patent, uniform pore sizes of 0.5 to 20 microns are achieved. However, this methodology is unsuitable for such electronic devices as integrated circuits where feature sizes are expected to go below 0.25 microns.

U.S. Pat. No. 6,420,441 (Allen et al.), discloses porogen particles that are substantially compatibilized with B-staged dielectric matrix materials. However, this patent application does not broadly teach how to prepare porous dielectric layers containing polyarylene materials.

Polyarylenes are well known dielectric materials. For example, U.S. Pat. No. 6,093,636 (Carter et al.) discloses a method for forming an integrated circuit containing a porous high temperature thermoset, such as a polyarylene. Such porous thermosets are prepared by using as pore forming material highly branched aliphatic esters that have functional groups that are further functionalized with appropriate reactive groups such that the functionalized aliphatic esters are incorporated into, i.e. copolymerized with, the vitrifying polymer matrix. Such incorporation of the pore forming material into the matrix restricts the mobility of the pore forming material, i.e. incorporation prevents phase separation of the pore forming material from the matrix. By restricting such mobility, the size of the phase-separated domains is also restricted. Also, the '636 patent does not teach how to prepare porous thermoset dielectric materials having a mean pore diameter $\leq 10$ nm, such as a diameter in the range of 0.75 to 8 nm.

International Patent Application WO 00/31183 (Bruza et al.) discloses a porous cross-linked thermoset dielectric matrix material, such as a polyarylene. This patent application discloses a number of porogens, such as solvents and polymers, particularly cross-linkable polymers. Suitable cross-linkable polymers are those that react to copolymerize with the thermoset dielectric matrix material. Suitable polymers useful as porogens include dendrimers, hyperbranched polymer systems and cross-linked latex particles. This patent application does not teach how to prepare porous thermoset dielectric materials having a mean pore diameter $\leq 10$ nm, such as a diameter in the range of 0.75 to 8 nm, nor how to prepare such porous materials where the porogens are substantially free of aggregation or agglomeration and without copolymerization with the dielectric matrix materials.

Other methods of preparing porous dielectric materials are known, but suffer from broad distributions of pore sizes, too large pore size, such as greater than 20 microns, or technologies that are too expensive for commercial use, such as liquid extractions under supercritical conditions.

There is thus a need for improved porous thermoset dielectric matrix materials with substantially smaller pore sizes and a greater percent by volume of pores for use in electronic components, and in particular, as an interlayer, or intermetal, dielectric material for use in the fabrication of integrated circuits. There is also a need for porous thermoset dielectric materials where the volume fraction of pores in the film is equivalent to the volume fraction of pore forming material.

SUMMARY OF THE INVENTION

It has now been surprisingly found that certain polymeric particles (or porogens) incorporated into thermoset dielectric matrix provide porous films having a suitable dielectric constant and sufficiently small pore size for use as insulating material in electronic devices such as integrated circuits and printed wiring boards. Such polymeric particles provide thermoset dielectric matrix material having a greater percentage of pores by volume and more uniformly dispersed pores than are available from known approaches.

In a first aspect, the present invention is directed to a method of preparing porous thermoset dielectric materials including the steps of: a) dispersing a plurality of removable cross-linked polymeric porogen particles in B-staged thermoset dielectric matrix material; b) forming a film of the B-staged thermoset dielectric matrix material; c) curing the B-staged thermoset dielectric matrix material to form a thermoset dielectric matrix material; and d) subjecting the thermoset dielectric matrix material to conditions which at least partially remove the porogen particles to form a porous thermoset dielectric material without substantially degrading the thermoset dielectric material; wherein the thermoset dielectric material is selected from the group consisting of benzocyclobutenes and polyarylenes; wherein the porogen particles are substantially compatible with the B-staged thermoset dielectric matrix material and wherein the porogen particles include as polymerized units one or more monomers selected from the group consisting of N-vinyl monomers and heteroatom-substituted styrene monomers and at least one (meth)acrylate cross-linking agent.

In a second aspect, the present invention is directed to porous thermoset dielectric materials prepared by the method described above.

In a third aspect, the present invention is directed to a method of preparing an integrated circuit including the steps of: a) depositing on a substrate a layer of a composition including B-staged thermoset dielectric matrix material having a plurality of cross-linked polymeric porogen particles dispersed therein; b) curing the B-staged thermoset dielectric matrix material to form a thermoset dielectric matrix material; c) subjecting the thermoset dielectric matrix material to conditions which at least partially remove the porogen particles to form a porous thermoset dielectric material layer without substantially degrading the thermoset dielectric material; d) patterning the thermoset dielectric layer; e) depositing a metallic film onto the patterned dielectric layer; and f) planarizing the film to form an integrated circuit; wherein the thermoset dielectric material is selected from the group consisting of benzocyclobutenes and polyarylenes; wherein the porogen particles are substantially compatible with the B-staged thermoset dielectric matrix material and wherein the porogen particles include as polymerized units one or more monomers selected from the group consisting of N-vinyl monomers and heteroatom-substituted styrene monomers and at least one (meth)acrylate cross-linking agent.

In a fourth aspect, the present invention is directed to an integrated circuit prepared by the method described above.

In a fifth aspect, the present invention is directed to a composition including B-staged thermoset dielectric matrix material and a plurality of cross-linked polymeric porogen particles; wherein the thermoset dielectric material is selected from the group consisting of benzocyclobutenes and polyarylenes; wherein the porogen particles are substantially compatible with the B-staged thermoset dielectric matrix material and wherein the porogen particles include as polymerized units one or more monomers selected from the group consisting of N-vinyl monomers and heteroatom-substituted styrene monomers and at least one (meth)acrylate cross-linking agent.

DETAILED DESCRIPTION OF THE INVENTION

As used throughout this specification, the following abbreviations shall have the following meanings, unless the context clearly indicates otherwise: ° C.=degrees centigrade; $\mu$m =micron=micrometer; UV=ultraviolet; rpm revolutions per minute; nm=nanometer; cm=centimeter; g=gram; wt %=weight percent; L=liter; mL=milliliter; STY=styrene; NVP=N-vinyl-pyrrolidone; NVPIM=N-vinylphthalimide; TMPTA=trimethylolpropane triacrylate; TMPTMA= trimethylolpropane trimethacrylate; 4FSTY=4-fluorostyrene; and VAS=4-vinylanisole.

The term "(meth)acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. The term "porogen" refers to a pore forming material, that is a polymeric material or particle dispersed in a dielectric material that is subsequently removed to yield pores, voids or free volume in the dielectric material. Thus, the terms "removable porogen," "removable polymer" and "removable particle" are used interchangeably throughout this specification. The terms "pore," "void" and "free volume" are used interchangeably throughout this specification. "Cross-linker" and "cross-linking agent" are used interchangeably throughout this specification and refer to a monomer containing two or more polymerizable sites, such as double or triple bonds. "Polymer" refers to polymers and oligomers, and also includes homopolymers and copolymers. The terms "oligomer" and "oligomeric" refer to dimers, trimers, tetramers and the like. "Monomer" refers to any ethylenically or acetylenically unsaturated compound capable of being polymerized. Such monomers may contain one or more double or triple bonds. "Halo" refers to fluoro, chloro, bromo and iodo. Likewise, "halogenated" refers to fluorinated, chlorinated, brominated and iodinated.

The term "B-staged" refers to uncured thermoset dielectric matrix materials. By "uncured" is meant any thermoset material that can be polymerized or cured to form higher molecular weight materials, such as coatings or films. Such B-staged material may be monomeric, oligomeric or mixtures thereof. B-staged material is further intended to include mixtures of polymeric material with monomers, oligomers or a mixture of monomers and oligomers. "Polyarylene" as used herein is intended to describe a wide variety of thermosetting resins or polymers having backbones containing arylene units. Such polyarylenes include polyarylene ethers.

Unless otherwise noted, all amounts are percent by weight and all ratios are by weight. All numerical ranges are inclusive and combinable in any order, except where it is obvious that such numerical ranges are constrained to add up to 100%.

The present invention relates to the synthesis, composition, size, distribution and purity of polymer particles useful as removable porogens, i.e., pore forming material. Such porogens are useful for forming porous thermoset dielectric materials in the fabrication of electronic and optoelectronic devices.

The present invention relates to a method of preparing porous thermoset dielectric materials including the steps of: a) dispersing a plurality of removable cross-linked polymeric porogen particles in B-staged thermoset dielectric material to form B-staged thermoset dielectric matrix material; b) forming a film of the B-staged thermoset dielectric matrix material; c) curing the B-staged thermoset dielectric matrix material to form a thermoset dielectric matrix material; and c) subjecting the thermoset dielectric matrix material to conditions which at least partially remove the porogen particles to form a porous thermoset dielectric material without substantially degrading the thermoset dielectric material; wherein the thermoset dielectric material is selected from the group consisting of benzocyclobutenes and polyarylenes; wherein the porogen particles are substantially compatible with the B-staged thermoset dielectric matrix material and wherein the porogen particles include as polymerized units one or more monomers selected from the group consisting of N-vinyl monomers and heteroatom-substituted styrene monomers and at least one (meth)acrylate cross-linking agent.

The porogens of the present invention are useful in reducing the dielectric constant of thermoset dielectric materials, particularly those materials having low dielectric constants ("k"). A low-k dielectric material is any material having a dielectric constant less than about 4.

Thermoset dielectric materials useful in the present invention include benzocyclobutenes, polyarylenes and mixtures thereof. Polyarylenes include polyarylene ethers. Suitable benzocyclobutenes include, but are not limited to, those disclosed in U.S. Pat. Nos. 4,540,763 and 4,812,588. A particularly suitable benzocyclobutene is 1,3-bis(2-bicyclo [4.2.0]octa-1,3,5-trien-3-ylethynyl)-1,1,3,3-tetramethyldisiloxane, sold under the tradename CYCLOTENE by the Dow Chemical Company (Midland, Mich.).

A wide variety of polyarylenes and polyarylene ethers may be used in the present invention. Suitable polyarylenes may be synthesized from precursors such as ethynyl aromatic compounds of the formula:

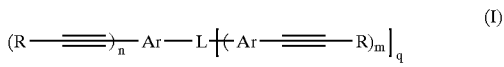
(I)

wherein each Ar is an aromatic group or inertly-substituted aromatic group: each R is independently hydrogen, an alkyl, aryl or inertly-substituted alkyl or aryl group; L is a covalent bond or a group which links one Ar to at least one other Ar; n and m are integers of at least 2; and q is an integer of at least 1. As such, the ethynyl aromatic compounds of the invention typically have four or more ethynyl groups (for example, tetraethynyl aromatic compounds) and are useful as monomers in the preparation of polymers,. including their oligomeric precursors.

In another aspect, the polyarylenes used in the invention may include a polymer including as polymerized units:

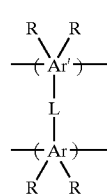
(II)

wherein Ar' is the residual of the reaction of product of $(C\equiv C)_n$-Ar or Ar-$(C\equiv C)_m$ moieties and R, L, n and m are as defined above.

In another embodiment, the polyarylene copolymers of the invention include as polymerized units a monomer having the formula:

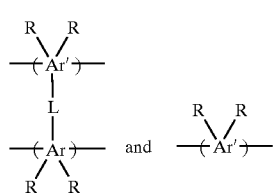
(III)

wherein Ar' and R are as defined above.

Exemplary polyarylenes include, but are not limited to, those wherein Ar-L-Ar are: biphenyl; 2,2-diphenyl propane; 9,9'-diphenyl fluorene; 2,2-diphenyl hexafluoro propane; diphenyl sulfide; oxydiphenylene; diphenyl ether; bis(phenylene)diphenylsilane; bis(phenylene) phosphine oxide; bis(phenylene)benzene; bis(phenylene)naphthalene; bis(phenylene)enthracene; thiodiphenylene; 1,1,1-triphenyleneethane; 1,3,5-triphenylenebenzene; 1,3,5-(2-phenylene-2-propyl)benzene; 1,1,1-triphenylenemethane; 1,1,2,2-tetraphenylene- 1,2-diphenylethane; bis(1,1-diphenyleneethyl)benzene; 2,2'-diphenylene-1,1,1,3,3,3-hexafluoropropane; 1,1-diphenylene-1-phenylethane; napthalene; anthracene; or bis(phenylene)napthacene; more preferably biphenylene; naphthylene; p,p'(2,2-diphenylene propane) (i.e., —C$_6$H$_4$—C(CH$_3$)$_2$—C$_6$H$_4$-); p,p'-(2,2-diphenylene-1,1,1,3,3,3-hexafluoropropene) and (—C$_6$H$_4$—C(CF$_3$)$_2$—C$_6$H$_4$—).

Useful bis-phenyl derivatives include 2,2-diphenyl propane; 9,9'-diphenyl fluorene; 2,2-diphenyl hexafluoro propane; diphenyl sulfide; diphenyl ether; bis(phenylene) diphenylsilane; bis(phenylene)phosphine oxide; bis (phenylene)benzene; bis(phenylene)naphthalene; bis (phenylene)anthracene; or bis(phenylene)napthacene.

The ethynyl groups on each Ar are either on adjacent carbon atoms or are vinylogously conjugated within the ring. It is believed that they dimerize upon application of heat to form an aromatic ring having a 1,4-diradical which serves to polymerize and/or cross-link the compound. While not being bound by theory, it is believed that this dimerization occurs via Bergman cyclization such as disclosed by Warner, et al. in Science, 268, Aug. 11, 1995, pp. 814–816.

The ethynyl aromatic monomer precursors to thermosetting polyarylenes are preferably bis(o-diethynyl) monomers (also referred to as BODA (bis(ortho-diacetylene) monomers)), which means there are at least two sets of adjacent substituted or vinylogously conjugated ethynyl groups on the monomer, that is, at least one set of ethynyl groups on each Ar group. Preferably, the ethynyl aromatic compound contains from 2 to 4, most preferably 2 or 3, diethynyl sets, most preferably, except when additional cross-linking is desired, two sets (i.e., four) of ethynyl groups.

The polyarylene precursor monomers may be prepared by a variety of methods known in the art, such as by: (a) selectively halogenating, preferably in a solvent, a polyphenol (preferably a bisphenol) to selectively halogenate, preferably brominate, each phenolic ring with one halogen on one of the two positions ortho to the phenolic hydroxyl group; (b) converting the phenolic hydroxyl on the resulting poly(ortho-halophenol), preferably in a solvent, to a leaving group such as a sulfonate ester (for example, a trifluoromethanesulfonate ester prepared from trifluoromethanesulfonyl halide or trifluoromethane sulfonic acid anhydride) which is reactive with and replaced by terminal ethynyl compounds; and (c) reacting the reaction product of step (b) with an ethynyl-containing compound or an ethynyl synthon in the presence of an aryl ethynylation, preferably palladium, catalyst and an acid acceptor to simultaneously replace the halogen and the trifluoromethylsulfonate with an ethynyl-containing group (for example, acetylene, phenylacetylene, substituted phenylacetylene or substituted acetylene). Further explanation of this synthesis is provided in PCT patent application WO 97/10193 (Babb).

The ethynyl aromatic monomers of Formula (I) are useful to prepare polymers of either Formula (II) or (III). While not being bound by theory, it is believed that the ethynyl groups, specifically those of ortho orientation, on the aromatic ring cyclize upon heating, forming a dehydro aromatic ring which reacts to form a polymer chain. Monomers with more than two ortho ethynyl groups (that is, more than one set of ethynyl groups) are used to form thermoset polymers and depending on the concentration of monomer having more than one set of ortho-ethynyl groups may contain from almost none (that is, a polymer having essentially repeat units of Formula (II) only to substantial segments of linear polymer chain structure (that is, a polymer of Formula (III)).

Polymerization of the ethynyl aromatic monomers is well within the ability of one skilled in the art. Typically, polymerization is achieved thermally and will generally occur at a temperature more than 150° C., but polymerization temperatures are preferably at least 180° C., and more preferably at least 210° C. The polymerization temperature preferably does not exceed that temperature which would result in undesirable degradation of the resulting polymer, which means polymerization is generally conducted at a temperature less than 300° C. for monomers having benzylic hydrogen atoms, and, for monomers not having a benzylic hydrogen, less than 450° C., preferably less than 400° C., and more preferably less than 350° C. The polymerization temperature will vary with Ar-L-Ar and R, with smaller R groups like H generally requiring lower temperatures than larger R groups, and more conjugated Ar and R (when aromatic) groups requiring lower temperatures than less conjugated Ar and R groups. For example, when R or Ar is anthracene, the polymerization is more advantageously conducted at a lower temperature than when Ar or R is phenyl. Polymerization is conveniently conducted at atmospheric pressure, but pressures higher or lower than atmospheric pressure can be employed.

The polymerization may be conducted in the presence of agents for controlling (accelerating) the cyclization reaction such as free radical initiators, or the chlorides disclosed by Warner, et al. in Science 269, pp. 814–816 (1995) can be employed in the polymerization reaction. While the specific conditions of polymerization are dependent on a variety of factors including the specific ethynyl aromatic monomer(s) being polymerized and the desired properties of the resulting polymer, in general, the conditions of polymerization are detailed in PCT application WO 97/10193 (Babb).

Particularly suitable polyarylenes for use in the present invention include those sold as SiLK™ Semiconductor Dielectric (available from The Dow Chemical Company), FLARE™ dielectric (available from Honeywell), and VELOX™ poly(arylene ether) (available from Air Products/Shumacher). Other particularly suitable polyarylenes include those disclosed in WO 00/31183, WO 98/11149, WO 97/10193, WO 91/09081, EP 755 957, and U.S. Pat. Nos. 5,115,082; 5,155,175; 5,179,188; 5,874,516; and 6,093,636, all herein incorporated by reference to the extent they teach polyarylene thermosets.

It will be appreciated that a mixture of dielectric materials may be used in the present invention, such as two or more thermoset dielectric materials or a mixture of a thermoset dielectric material with one or more other dielectric materials, i.e. not a thermoset dielectric material. Suitable other dielectric materials include, but are not limited to, inorganic materials such as organo polysilicas, carbides, oxides, nitrides and oxyfluorides of silicon, boron, or aluminum; and organic matrix materials such as poly(aryl esters), poly(ether ketones), polycarbonates, polynorbomenes, poly(arylene ethers), poly(perfluorinated hydrocarbons) such as poly(tetrafluoroethylene), and polybenzoxazoles. Thus, the porogens of the present invention may be combined with a thermoset/other dielectric material mixture to form a thermoset/other dielectric matrix composite material.

The porogen polymers of the present invention are cross-linked particles and have a molecular weight or particle size suitable for use as a modifier in advanced interconnect structures in electronic devices. Typically, the useful mean particle size range for a plurality of these particles for such applications is up to about 1,000 nm, such as that having a mean particle size in the range of about 0.75 to about 1000 nm. It is preferred that the mean particle size is in the range of about 0.75 to about 200 nm, more preferably from about 0.75 to about 50 nm, and most preferably from about 1 nm to about 20 nm. An advantage of the present process is that the size of the pores formed in the dielectric matrix are substantially the same size, i.e., dimension, as the size of the removed porogen particles used. Thus, the porous dielectric material made by the process of the present invention has substantially uniformly dispersed pores with substantially uniform pore sizes having a mean pore size in the range of from 0.75 to 1000 nm, preferably 0.75 to 200 nm, more preferably 0.75 and 50 nm and most preferably 1 to 20 nm. Particularly suitable pore sizes are $\leq 10$ nm, such as $\leq 5$ nm, $\leq 3$ nm and $\leq 2$ nm.

The cross-linked polymeric porogens include as polymerized units at least one monomer selected from N-vinyl monomers and heteroatom-substituted styrene monomers. N-vinyl monomers suitable for use in the present invention include, but are not limited to: vinylpyridines such as 2-vinylpyridine or 4-vinylpyridine; ($C_1$–$C_8$)alkyl substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; N-vinylcaprolactam; N-vinylbutyrolactam; N-vinylpyrrolidone; vinyl imidazole; N-vinyl carbazole; N-vinyl-succinimide; N-vinyl-oxazolidone; N-vinylphthalimide; N-vinyl-pyrrolidones such as N-vinyl-thio-pyrrolidone, 3-methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines. Preferred N-vinyl monomers are N-vinylpyrrolidone and N-vinylphthalimide.

Heteroatom-substituted styrene monomers useful in the present invention are any styrene monomers having one or more of the aromatic hydrogens replaced with a heteroatom-containing substituent. Suitable heteroatom-containing substituents include, but are not limited to, ($C_1$–$C_{10}$)alkoxy, halo, amino, ($C_1$–$C_{10}$)alkylamino, di($C_1$–$C_{10}$)alkylamino, nitro, cyano, carboxy, halo($C_1$–$C_{10}$)alkyl, carb($C_1$–$C_{10}$) alkoxy and the like. Exemplary heteroatom-substituted styrene monomers include, but are not limited to, vinylanisole, o-, m-, or p-aminostyrene, 4-fluorostyrene, 3-fluorostyrene, vinyldimethoxybenzene, and the like. Preferred heteroatom substituted styrene monomers are vinylanisole, and o-, m-, or p-aminostyrene, and more preferably vinylanisole.

The amount of N-vinyl monomers or heteroatom-substituted styrene monomers of the present invention is typically from about 1 to about 99% wt, based on the total weight of the monomers used. It is preferred that these monomers are present in an amount of from 1 to about 90% wt, and more preferably from about 5 to about 90% wt. It will be appreciated that a mixture of N-vinyl monomers and heteroatom-substituted styrene monomers may be used in the present porogens.

In addition to the N-vinyl monomers or heteroatom-substituted styrene monomers, the present porogens may further contain as polymerized units one or more ethylenically or acetylenically unsaturated monomers, including, but not limited to, (meth)acrylic acid, (meth)acrylamides, alkyl (meth)acrylates, alkenyl (meth)acrylates, aromatic (meth) acrylates, vinyl aromatic monomers, nitrogen-containing compounds, substituted ethylene monomers, and poly (alkylene oxide) monomers.

Typically, the alkyl (meth)acrylates useful in the present invention are ($C_1$–$C_{24}$) alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy($C_2$–$C_6$)alkyl (meth)acrylates, dialkylamino ($C_2$–$C_6$)alkyl (meth)acrylates, dialkylamino($C_2$–$C_6$)alkyl (meth)acrylamides.

Useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof.

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri ($C_1$–$C_6$)alkylsilyl (meth)acrylate, γ-propyl di($C_1$–$C_6$)alkoxy ($C_1$–$C_6$)alkylsilyl (meth)acrylate, γ-propyl di($C_1$–$C_6$)alkyl ($C_1$–$C_6$)alkoxysilyl (meth)acrylate, vinyl tri($C_1$–$C_6$) alkoxysilyl (meth)acrylate, vinyl di($C_1$–$C_6$)alkoxy($C_1$–$C_6$) alkylsilyl (meth)acrylate, vinyl ($C_1$–$C_6$)alkoxydi($C_1$–$C_6$) alkylsilyl (meth)acrylate, vinyl tri($C_1$–$C_6$)alkylsilyl (meth) acrylate, and mixtures thereof.

The vinylaromatic monomers useful as unsaturated monomers in the present invention include, but are not limited to: styrene ("STY"), α-methylstyrene, vinyltoluene, p-methylstyrene, ethylvinylbenzene, vinylnaphthalene, vinylxylenes, and mixtures thereof.

Substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride and vinylidene bromide.

Suitable poly(alkylene oxide) monomers include, but are not limited to, poly(propylene oxide) monomers, poly (ethylene oxide) monomers, poly(ethylene oxide/propylene oxide) monomers, poly(propylene glycol) (meth)acrylates, poly(propylene glycol) alkyl ether (meth)acrylates, poly (propylene glycol) phenyl ether (meth)acrylates, poly (propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylene/ethylene glycol) alkyl ether (meth)acrylates and mixtures thereof. Preferred poly (alkylene oxide) monomers include trimethoylolpropane ethoxylate tri(meth)acrylate, trimethoylolpropane propoxylate tri(meth)acrylate, poly(propylene glycol) methyl ether acrylate, and the like. Particularly suitable poly(propylene glycol) methyl ether acrylate monomers are those having a molecular weight in the range of from about 200 to about 2000. The poly(ethylene oxide/propylene oxide) monomers useful in the present invention may be linear, block or graft copolymers. Such monomers typically have a degree of polymerization of from about 1 to about 50, and preferably from about 2 to about 50.

Typically, the amount of such additional monomers useful in the porogen particles of the present invention is from about 1 to about 99% wt, based on the total weight of the monomers used. The amount of such additional monomers is preferably from about 2 to about 90% wt, and more preferably from about 5 to about 80% wt.

The porogen particles of the present invention also contain as polymerized units one or more cross-linking agents. At least one cross-linking agent is a (meth)acrylate cross-linking agent. Suitable (meth)acrylate cross-linkers useful in the present invention include di-, tri-, tetra-, or higher multi-functional (meth)acrylate unsaturated monomers. Examples of (meth)acrylate cross-linkers useful in the present invention include, but are not limited to: ethyleneglycol diacrylate, trimethylolpropane triacrylate, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), glycidyl methacrylate, 2,2-dimethylpropane-1,3-diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, and mixtures thereof.

One or more additional cross-linking agents may be combined with the (meth)acrylate cross-linking agent. A wide variety of cross-linking agents may suitable be combined with the (meth)acrylate cross-linker. Such additional cross-linking agents include, but are not limited to, trivinylbenzene, divinyltoluene, divinylpyridine, divinylnaphthalene, divinylxylene, diethyleneglycol divinyl ether, trivinylcyclohexane, divinyl benzene, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), tetraallylsilane, 1,3-dimethyl tetravinyldisiloxane, 1,3-divinyl tetramethyldisiloxane and mixtures thereof.

The (meth)acrylate cross-linking agents and additional cross-linking agents may be used in a wide range of amounts, such as from 1 to 99%, based on the total weight of monomers and cross-linking agents. It is preferred that the amount of cross-linking agent is from 5 to 95%, more preferably from 8 to 90%, and still more preferably from 10 to 50%.

In general, suitable B-staged thermoset dielectric materials useful in the present invention have a molecular weight of less than or equal to about 100,000. Preferably, the molecular weight of the B-staged thermoset dielectric material is from about 1000 to about 50,000, and more preferably from 1000 to 35,000. As the molecular weight of the B-staged dielectric material increases above about 35,000, it becomes increasingly difficult for the porogen particles to be compatible with the dielectric material. In cases where the molecular weight is greater than about 35,000, particularly greater than or equal to 50,000, it is preferred that the N-vinyl monomers or heteroatom-substituted styrene monomers be present in the porogen particles in an amount of at least 20% based on the total weight of the monomers and cross-linker, and more preferably greater than 20%, such as 25%, 30%, 35%, 40% and most preferably at least 45%. For B-staged thermoset dielectric materials having molecular weights greater than about 35,000, it is preferred that the porogen particles include N-vinylpyrrolidone as polymerized units. In addition, for such thermoset materials one or more different monomers may also be required to compatiblize the porogen. Such monomers include, but are not limited to, vinyl benzoate, vinyl naphthalene, vinyl biphenyl and 4-allyl-2-methoxyphenol. In such cases, a (meth)acrylate cross-linking agent is still used. In an alternate embodiment, when the B-staged dielectric material is benzocyclobutene, it is preferred that the porogen particles include vinylanisole as polymerized units.

The polymers useful as porogen particles in the present invention may be prepared by a variety of polymerization techniques, such as solution polymerization or emulsion polymerization, and preferably by solution polymerization. The solution polymers useful in the present invention may be copolymers or homopolymers and are cross-linked.

The solution polymers of the present invention may be prepared by a variety of methods, such as those disclosed in U.S. Pat. No. 5,863,996 (Graham) and U.S. patent application Ser. No. 09/460,326, both of which are hereby incorporated by reference to the extent they teach the preparation of such polymers. The solution polymers of the present invention are generally prepared in a non-aqueous solvent. Suitable solvents for such polymerizations are well known to those skilled in the art. Examples of such solvents include, but are not limited to: hydrocarbons, such as alkanes, fluorinated hydrocarbons, and aromatic hydrocarbons, ethers, ketones, esters, alcohols and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, methylisobutyl ketone, diisobutylketone, propyleneglycol monomethyl ether, decanol, and t-butanol.

The solution polymer porogen particles of the present invention typically have a weight average molecular weight in the range of 5,000 to 1,000,000, preferably in the range of 10,000 to 500,000 and more preferably in the range of 10,000 to 100,000. These solution polymer porogen particles typically have a particle size up to about 1,000 nm, such as in the range of 0.75 to 1000 nm. It is preferred that the mean particle size of a plurality of these particles is in the range of about 0.75 to about 100 nm, more preferably from about 0.75 about 50 nm, and most preferably from about 1 nm to about 20 nm. Particularly useful porogen particles are those having a mean particle size of <10 nm, particularly <5 nm, such as 1 nm, 2 nm or 3 nm. The polydispersity of these solution polymers is in the range 1 to 20 and more preferably in the range of 1.001 to 15 and most preferably in the range of 1.001 to 10.

The emulsion polymers useful in the present invention are generally prepared the methods described in U.S. patent application Ser. No. 09/460,326, described above. Controlled polymerization of the monomers in these droplets produces small polymer particles, i.e. ≦100 nm, and preferably extremely small polymer particles, i.e. ≦50 nm in size. Emulsion polymers having other suitable mean particle sizes, such as ≦45 nm, ≦40 nm, ≦35 nm, and ≦30 nm, may be produced according to the present invention. Such polymer particles typically have a lower mean particle size of about 1 nm. Thus, the present polymer particles have a mean particle size range of from 0.75 to 100 nm, and preferably from 1 to 50 nm. The particle size polydispersity of these emulsion polymer particles is in the range 1.0001 to 10, more preferably 1.001 to 5, and most preferably 1.001 to 2.5.

It is preferred that the polymers of the present invention are prepared using anionic polymerization or free radical polymerization techniques. It is also preferred that the polymers useful in the present invention are not prepared by step-growth polymerization processes.

The porogen particles of the present invention may be directly added to the B-staged thermoset dielectric material as is or may be first purified to remove impurities that might effect the electrical or physical properties of electronic devices. Purification of the porogen particles may be accomplished either by precipitation of the porogen particles or adsorption of the impurities.

In general, the cross-linked particles of the present invention useful as porogens must be dispersible, miscible or otherwise substantially compatible with the host B-staged dielectric matrix material in solution and in the thin film. Thus, the porogen particles must be soluble in the same solvent or mixed solvent system as the host B-staged thermoset dielectric matrix material. Also, the porogen particles must be present within this solution as substantially discrete, substantially non-aggregated or substantially non-agglomerated particles in order to achieve the desired benefit of this invention, namely substantially uniformly dispersed pores with a size comparable to that of the porogen's size. This is accomplished by modifying the porogen particle composition such that it is "compatible" with the host B-staged thermoset dielectric matrix material.

It has been surprisingly found that when the present porogen particles include as polymerized units at least one monomer selected from N-vinyl monomers and heteroatom-substituted styrene monomers and at least one (meth)acrylate cross-linking agent, that such porogen particles are substantially compatible with B-staged thermoset dielectric matrix materials. Such porogen particles, when added to B-staged thermoset dielectric materials, remain as substantially discrete, substantially non-aggregated or substantially non-agglomerated particles. In this way, porous materials are obtained containing pores having a mean pore diameter substantially equal to the mean pore diameter of the porogen particles used. Thus, very large pores, such as so-called "killer defects or pores" obtained upon agglomeration or aggregation of porogens, are substantially reduced or eliminated according to the present invention. Thus, the present invention provides porous thermoset dielectric materials having much smaller pores, more uniformly sized pores and more uniformly dispersed pores than conventional methods.

An advantage of the present invention is that the porogen particles are substantially compatible, and preferably fully compatible, with the dielectric material used. By "compatible" is meant that a composition of B-staged thermoset dielectric matrix material and a plurality of porogen particles are optically transparent to visible light. It is preferred that a solution of B-staged thermoset dielectric matrix material and porogen particles, a film or layer including a composition of B-staged thermoset dielectric material and porogen particles, a composition including B-staged thermoset dielectric matrix material having porogen particles dispersed therein, and the resulting porous dielectric material after removal of the porogen particles are all optically transparent to visible light. By "substantially compatible" is meant that a composition of B-staged polyimide dielectric matrix material and a plurality of porogen particles is slightly cloudy or slightly opaque. Preferably, "substantially compatible" means at least one of a solution of B-staged thermoset dielectric matrix material and porogen particles, a film or layer including a composition of B-staged thermoset dielectric matrix material and porogen particles, a composition including B-staged thermoset dielectric matrix material having porogen particles dispersed therein, and the resulting porous thermoset dielectric material after removal of the porogen particles is slightly cloudy or slightly opaque.

To be compatible, the porogen particles must be soluble or miscible in the B-staged thermoset dielectric matrix material, in the solvent used to dissolve the B-staged thermoset dielectric matrix material or both. When a film or layer of a composition including the B-staged thermoset dielectric material, a plurality of porogen particles and solvent is cast, such as by spin casting, much of the solvent evaporates. After such film casting, the porogen particles must be soluble in the B-staged thermoset dielectric matrix material so that it remains substantially uniformly dispersed. If the porogen particles are not compatible, phase separation of the porogen particles from the B-staged thermoset dielectric matrix material occurs and large domains or aggregates form, resulting in an increase in the size and non-uniformity of pores. Such compatible porogen particles provide cured dielectric materials having substantially uniformly dispersed pores having substantially the same sizes as the porogen particles.

The compatibility of the porogen particles and B-staged thermoset dielectric matrix material is typically determined by a matching of their solubility parameters, such as the Van Krevelen parameters of delta h and delta v. See, for example, Van Krevelen et al., *Properties of Polymers. Their Estimation and Correlation with Chemical Structure,* Elsevier Scientific Publishing Co., 1976; Olabisi et al., *Polymer-Polymer Miscibility,* Academic Press, N.Y., 1979; Coleman et al., *Specific Interactions and the Miscibility of Polymer Blends,* Technomic, 1991; and A. F. M. Barton, *CRC Handbook of Solubility Parameters and Other Cohesion Parameters,* $2^{nd}$ Ed., CRC Press, 1991. Delta h is a hydrogen bonding parameter of the material and delta v is a measurement of both dispersive and polar interaction of the material. Such solubility parameters may either be calculated, such as by the group contribution method, or determined by measuring the cloud point of the material in a mixed solvent system consisting of a soluble solvent and an insoluble solvent. The solubility parameter at the cloud point is defined as the weighted percentage of the solvents. Typically, a number of cloud points are measured for the material and the central area defined by such cloud points is defined as the area of solubility parameters of the material.

When the solubility parameters of the porogen particles and B-staged thermoset dielectric matrix material are substantially similar, the porogen particles will be compatible with the dielectric matrix material and phase separation and/or aggregation of the porogen particles is less likely to occur. It is preferred that the solubility parameters, particularly delta h and delta v, of the porogen particles and B-staged thermoset dielectric matrix material are substantially matched. It will be appreciated by those skilled in the art that the properties of the porogen particles that affect the particles' solubility also affect the compatibility of these particles with the B-staged thermoset dielectric matrix material. It will be further appreciated by those skilled in the art that porogen particles may be compatible with one thermoset dielectric matrix material, but not another. This is due to the difference in the solubility parameters of the different B-staged thermoset dielectric matrix materials.

To be useful as porogen particles in forming porous dielectric materials, the porogens of the present invention must be at least partially removable under conditions which do not adversely affect the dielectric matrix material, preferably substantially removable, and more preferably completely removable. By "removable" is meant that the polymer depolymerizes or otherwise breaks down into volatile components or fragments which are then removed from, or migrate out of, the dielectric material yielding pores or voids. Any procedures or conditions which at least partially remove the porogen without adversely affecting the dielectric matrix material may be used. It is preferred that the porogen is substantially removed. Typical methods of removal include, but are not limited to, exposure to heat or radiation, such as, but not limited to, UV, x-ray, gamma ray, alpha particles, neutron beam or electron beam. It is preferred that the matrix material is exposed to heat or UV light to remove the porogen.

The porogen particles of the present invention can be thermally removed under vacuum, nitrogen, argon, mixtures of nitrogen and hydrogen, such as forming gas, or other inert or reducing atmosphere. The porogen particles of the present invention may be removed at any temperature that is higher than the thermal curing temperature of the B-staged thermoset matrix material and lower than the thermal decomposition temperature of the thermoset dielectric material. Typically, the porogen particles of the present invention may be removed at temperatures in the range of 150° to 500° C. and preferably in the range of 250° to 450° C. Typically, the porogen particles of the present invention are removed upon heating for a period of time in the range of 1 to 120 minutes. An advantage of the porogens of the present invention is that 0 to 20% by weight of the porogen remains after removal from the thermoset dielectric material.

In one embodiment, when a porogen of the present invention is removed by exposure to radiation, the porogen polymer is typically exposed under an inert atmosphere, such as nitrogen, to a radiation source, such as, but not limited to, visible or ultraviolet light. The porogen fragments generated from such exposure are removed from the matrix material under a flow of inert gas. The energy flux of the radiation must be sufficiently high to generate a sufficient number of free radicals such that porogen particle is at least partially removed. It will be appreciated by those skilled in the art that a combination of heat and radiation may be used to remove the porogens of the present invention.

In preparing the dielectric matrix materials of the present invention, the porogen particles described above are first dispersed within, or dissolved in, a B-staged thermoset dielectric material. Any amount of porogen particles may be combined with the B-staged thermoset dielectric matrix materials according to the present invention. The amount of porogen particles used will depend on the particular porogen employed, the particular B-staged thermoset dielectric matrix material employed, and the extent of dielectric constant reduction desired in the resulting porous dielectric material. Typically, the amount of porogen particles used is in the range of from 1 to 90 wt %, based on the weight of the B-staged thermoset dielectric matrix material, preferably from 10 to 80 wt %, more preferably from 15 to 60 wt %, and still more preferably from 15 to 30 wt %. A particularly useful amount of porogen is in the range of form about 1 to about 60 wt %.

The porogen particles of the present invention may be combined with the B-staged thermoset dielectric material by any methods known in the art. Typically, the B-staged thermoset material is first dissolved in a suitable solvent, such as, but not limited to, methyl isobutyl ketone, diisobutyl ketone, 2-heptanone, γ-butyrolactone, ε-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes, or mixtures thereof, to form a solution. The porogen particles are then dispersed or dissolved within the solution. The resulting dispersion is then deposited on a substrate by methods known in the art, such as spin coating, spray coating or doctor blading, to form a film or layer.

After being deposited on a substrate, the B-staged thermoset dielectric matrix material is then substantially cured to form a film, layer or coating. The dielectric matrix material is typically cured by heating at a temperature below that required for removal of the porogen. Suitable cure temperatures for the B-staged thermoset dielectric matrix material vary across a wide range but are generally from about 150° to about 455° C., preferably from about 200° to about 400° C.

Once the B-staged thermoset dielectric matrix material is cured, the film is subjected to conditions which remove the porogen particles without substantially degrading the polyimide dielectric material, that is, less than 5% by weight of the dielectric material is lost. Typically, such conditions include exposing the film to heat and/or radiation. It is preferred that the material is exposed to heat or light to remove the porogen. To remove the porogen particles thermally, the dielectric material can be heated by oven heating or microwave heating. Under typical thermal removal conditions, the polymerized dielectric material is heated to about 300° to about 450° C. It will be recognized by those skilled in the art that the particular removal temperature of a thermally labile porogen will vary according to composition of the porogen. The choice of porogen particles will depend upon the thermal degradation temperature of the thermoset dielectric material. Upon removal, the porogen polymer depolymerizes or otherwise breaks down into volatile components or fragments which are then removed from, or migrate out of, the dielectric matrix material yielding pores or voids, which fill up with the carrier gas used in the process. Thus, a porous thermoset dielectric material having voids is obtained, where the size of the voids is substantially the same as the particle size of the porogen. The resulting dielectric material having voids thus has a lower dielectric constant than such material without such voids.

The compatible, i.e., optically transparent, compositions of the present invention do not suffer from agglomeration or long range ordering of porogen materials, i.e. the porogen particles are substantially uniformly dispersed throughout the B-staged thermoset dielectric matrix material. Thus, the porous thermoset dielectric materials resulting from removal of the porogen particles have substantially uniformly dispersed pores. Such substantially uniformly dispersed, very small pores are very effective in reducing the dielectric constant of the dielectric materials.

A further advantage of the present invention is that low dielectric constant materials are obtained having uniformly dispersed voids, a higher volume of voids than known dielectric materials and/or smaller void sizes than known dielectric materials. These voids are on the order of 0.75 to 1000 nm, preferably 0.75 to 200 nm, more preferably 0.75 to 50 nm, and most preferably 1 to 20 nm. Particularly suitable are pores having a mean pore size of $\leq 10$ nm, $\leq 5$ nm, ≦3 nm, and ≦2 nm. Further, the void size can be adjusted, from 1 to 1000 nm and above, by varying the size of the removable porogen particles. The resulting porous theromoset dielectric material has low stress, less brittleness, low dielectric constant, low refractive index, improved toughness and improved compliance during mechanical contacting to require less contact force during compression. The porogens of the present invention also act as impact modifiers for the thermoset materials and improve thermoset film formation as well as film properties.

The porogens of the present invention are compatible with B-staged thermoset material without the need for further functionalization of the porogen. It is preferred that the present porogens are not further functionalized, and particularly that they are not further surface functionalized. Also, the present porogens are not incorporated into the vitrifying polymer, i.e. the porogens are not copolymerized with the B-staged thermoset dielectric material. The present porogen particles are compatibilized with the B-staged thermoset matrix material by appropriate choice of monomer, cross-linking agent or both. The present porogens can be mixed or blended with the B-staged thermoset material without macroscopic phase separation. Phase separation typically results in a visually detectable second layer, i.e. the compositions are opaque. The compositions of the present invention containing porogen particles in a thermoset dielectric matrix material are substantially non-phase separated and preferably are not phase separated. Surprisingly, phase separation of the porogens is prevented according to the present invention by compatibilizing the porogens with the thermoset dielectric matrix material. Such compatibilization, which is based on solubility, is achieved by choice of monomers used to prepare the porogen, not by immobilizing (i.e. copolymerizing) the porogen in the matrix polymer.

The porous thermoset dielectric material made by the process of the present invention is suitable for use in any application where a low refractive index or low dielectric constant material may be used. When the porous dielectric material of the present invention is a thin film, it is useful as insulators, anti-reflective coatings, sound barriers, thermal breaks, insulation, optical coatings and the like. The porous thermoset dielectric materials of the present invention are preferably useful in electronic and optoelectronic devices including, but not limited to, the fabrication of multilevel integrated circuits, e.g. microprocessors, digital signal processors, memory chips and band pass filters, thereby increasing their performance and reducing their cost.

The porous thermoset dielectric materials of the present invention are particularly suitable for use in integrated circuits, optoelectronic devices and wireless devices such as mobile telephones. The present porous thermosets are suitable used on a variety of substrates, such as, but not limited to, gallium arsenide, silicon-germanium, silicon-on-insulator, silicon, alumina, aluminum-nitride, printed wiring boards, flexible circuits, multichip modules, flip chips, copper, copper alloys, aluminum, high dielectric materials, low dielectric materials, resistors, barrier layers such as titanium or tantalum nitride, etch stop or cap layers such as silicon nitride, silicon oxide or silicon oxycarbide, and the like. It will be appreciated that an overlayer may be applied to such porous thermosets in certain applications.

In one embodiment of integrated circuit manufacture, as a first step, a layer of a composition including B-staged thermoset dielectric matrix material having a plurality of cross-linked polymeric porogen dispersed or dissolved therein and optionally a solvent is deposited on a substrate. Suitable deposition methods include spin casting, spray casting and doctor blading. Suitable optional solvents include, but are not limited to: methyl isobutyl ketone, diisobutyl ketone, 2-heptanone, γ-butyrolactone, ε-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes or mixtures thereof. Suitable substrates include, but are not limited to: silicon, silicon dioxide, silicon oxycarbide, silicon germanium, silicon-on-insulator, glass, silicon nitride, ceramics, aluminum, copper, gallium arsenide, plastics, such as polycarbonate, circuit boards, such as FR-4 and polyimide, and hybrid circuit substrates, such as aluminum nitride-alumina. Such substrates may further include thin films deposited thereon, such films including, but not limited to: metal nitrides, metal carbides, metal silicides, metal oxides, and mixtures thereof. In a multilayer integrated circuit device, an underlying layer of insulated, planarized circuit lines can also function as a substrate.

In a second step in the manufacture of integrated circuits, the B-staged thermoset matrix material is cured to form a thermoset dielectric matrix material. In a third step, the resulting cured thermoset dielectric matrix material is then subjected to conditions such that the porogen particles contained therein is substantially removed without adversely affecting the dielectric material to yield a porous thermoset dielectric material.

The porous thermoset dielectric material is then lithographically patterned to form vias, and/or trenches in subsequent processing steps. The trenches generally extend to the substrate and connect to at least one metallic via. Typically, lithographic patterning involves (i) coating the dielectric material layer with a positive or negative photoresist, such as those marketed by Shipley Company (Marlborough, Mass.); (ii) imagewise exposing, through a mask, the photoresist to radiation, such as light of appropriate wavelength or e-beam; (iii) developing the image in the resist, e.g., with a suitable developer; and (iv) transferring the image through the dielectric layer to the substrate with a suitable transfer technique such as reactive ion beam etching. Optionally, an antireflective composition may be disposed on the dielectric material prior to the photoresist coating. Such lithographic patterning techniques are well known to those skilled in the art.

A metallic film is then deposited onto the patterned dielectric layer to fill the trenches. Preferred metallic materials include, but are not limited to: copper, tungsten, gold, silver, aluminum or alloys thereof. The metal is typically deposited onto the patterned dielectric layer by techniques well known to those skilled in the art. Such techniques include, but are not limited to: chemical vapor deposition ("CVD"), plasma-enhanced CVD, combustion CVD ("CCVD"), electro and electroless deposition, sputtering, or the like. Optionally, a metallic liner, such as a layer of nickel, tantalum, titanium, tungsten, or chromium, including nitrides or silicides thereof, or other layers such as barrier or adhesion layers, e.g. silicon nitride or titanium nitride, is deposited on the patterned and etched dielectric material.

In a fifth step of the process for integrated circuit manufacture, excess metallic material is removed, e.g. by planarizing the metallic film, so that the resulting metallic material is generally level with the patterned dielectric layer. Planarization is typically accomplished with chemical/mechanical polishing or selective wet or dry etching. Such planarization methods are well known to those skilled in the art.

It will be appreciated by those skilled in the art that multiple layers of dielectric material, including multiple layers of thermoset dielectric material, and metal layers may subsequently be applied by repeating the above steps. The above steps in the manufacture of an electronic device may further include one or more other steps, such as, but not limited to, the application of etch stops, cap layers, barrier layers, seed layers and the like. It will be further appreciated by those skilled in the art that the compositions of the present invention are useful in any and all methods of integrated circuit manufacture.

The following examples are presented to illustrate further various aspects of the present invention, but are not intended to limit the scope of the invention in any aspect.

EXAMPLE 1

A vinylanisole containing cross-linked porogen was prepared by polymerizing the monomers vinylanisole/styrene/trimethylolpropane triacrylate in a weight ratio of 45/45/10.

Approximately 2 mL of a 35 wt % solids solution of a commercially available B-staged benzocyclobutene ("BCB") in mesitylene and 2 mL of a 15 wt % solids solution of the porogen in mesitylene were combined in a 20 mL vial and mixed thoroughly. The resultant pale yellow transparent solution contained 70% BCB and 30% porogen with a total solids content of 25%. 2 mL of the solution was disposed by a pipette onto a stationary 4 inch (ca. 10 cm) wafer on a spin coater. The wafer was then spun at 2500 rpm for 30 seconds and the wafer was removed and the film visually examined. The BCB/porogen film was clear and free of visible defects, striations or haze. The wafer was then heated to 150° C. on a brass hot plate for 1 minute to remove excess solvent. The film was then again visually examined and was clear and free of visible defects, striations or haze. Thus, the porogen was compatible with the B-staged BCB dielectric material.

EXAMPLE 2

The following porogen samples were prepared by polymerizing the monomers in the amounts reported in Table 1.

TABLE 1

| Porogen Sample | Monomer A | Monomer B | Cross-linker C | A/B/C |
|---|---|---|---|---|
| A | STY | NVP | TMPTA | 45/45/10 |
| B | NVP | — | TMPTA | 90/10 |
| C | STY | NVP | TMPTA | 80/10/10 |
| D | STY | VAS | TMPTA | 45/45/10 |
| E | STY | NVPIM | TMPTA | 45/45/10 |
| F | STY | 4FSTY | TMPTA | 80/10/10 |
| G | STY | VAS | TMPTA | 80/10/10 |

EXAMPLE 3

The compatibility of a number of porogen samples from Example 2 in B-staged polyarylene ether dielectric materials in cyclohexanone was determined. The B-staged polyarylene ether material was either VELOX A poly(arylene ether) ("Polyarylene ether A") or VELOX N poly(arylene ether) ("Polyarylene ether N"), both available from Air Products/Shumacher. Both commercially available B-staged materials had a molecular weight of approximately 50,000. Compatibility determinations were performed by visually inspecting a film of the B-staged polyarylene ether dielectric material and porogen that was spun cast on a silicon wafer at 1000 rpm. The porogen was loaded into the B-staged polyarylene dielectric material at ca. 50% by weight with a total solids content of ca. 20%. The film thicknesses were from 0.9 to 2 µm. All visual inspections were by naked-eye under daylight. Film compatibility of the porogen in the polyarylene ether dielectric material was determined after removal of the solvent, but before removal of the porogen. The compatibility results are reported in Table 2.

TABLE 2

| Polyarylene Ether | Porogen Sample | Solution Compatibility | Film Compatibility |
|---|---|---|---|
| A | A | clear | clear |
|   | B | clear | clear |
|   | C | cloudy | — |
| N | A | clear | clear |
|   | B | clear | clear |
|   | C | cloudy | — |

From these data, it can be clearly seen that Porogen Samples A and B were compatible with both polyarylene ether samples. Porogen Sample C, which contained the same components as Porogen Sample A, did not contain a sufficient amount of NVP to compatiblize the porogen with the high molecular weight (ca. 50,000) B-staged polyarylene ether.

What is claimed is:

1. A method of preparing an integrated circuit comprising the steps of:
   a) depositing on a substrate a layer of a composition comprising B-staged thermoset dielectric matrix material having a plurality of cross-linked polymeric porogen particles dispersed therein;
   b) curing the B-staged thermoset dielectric matrix material to form a thermoset dielectric matrix material wherein the porogen particles are not copolymerized with the B-staged thermoset dielectric matrix material;
   c) subjecting the thermoset dielectric matrix material to conditions which at least partially remove the porogen particles to form a porous thermoset dielectric material layer without substantially degrading the thermoset dielectric material;
   d) patterning the thermoset dielectric layer;
   e) depositing a metallic film onto the patterned dielectric layer; and
   f) planarizing the film to form an integrated circuit; wherein the thermoset dielectric material is selected from the group consisting of benzocyclobutenes and polyarylenes; wherein the porogen particles are substantially compatible with the B-staged thermoset dielectric matrix material and wherein the porogen particles comprise as polymerized units one or more monomers selected from the group consisting of N-vinyl monomers and heteroatom-substituted styrene monomers and at least one (meth)acrylate cross-linking agent.

2. The method of claim 1 wherein the plurality of porogen particles has a mean particle size of $\leq 10$ nm.

3. The method of claim 1 wherein the (meth)acrylate cross-linking agent is selected from the group consisting of ethyleneglycol diacrylate, trimethylolpropane triacrylate, allyl methacrylate, ethyleneglycol dimethacrylate, diethyleneglycol dimethacrylate, propyleneglycol dimethacrylate, propyleneglycol diacrylate, trimethylolpropane trimethacrylate, glycidyl methacrylate, 2,2-dimethylpropane-1,3-diacrylate, 1,3-butylene glycol diacrylate, 1,3-butylene glycol dimethacrylate, 1,4- butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, and mixtures thereof.

4. The method of claim 1 wherein the N-vinyl monomers are selected from the group consisting of vinylpyridines, $(C_1-C_8)$alkyl substituted N-vinyl pyridines; N-vinylcaprolactam; N-vinylbutyrolactam; N-vinylpyrrolidone; vinyl imidazole; N-vinyl carbazole; N-vinyl-succinimide; N-vinyl-oxazolidone; N-vinylphthalimide; N-vinyl-pyrrolidones; vinyl pyrroles; vinyl anilines; and vinyl piperidines.

5. The method of claim 1 wherein the N-vinyl monomers are selected from the group consisting of N-vinylpyrrolidone and N-vinylphthalimide.

6. The method of claim 1 wherein the heteroatom-substituted styrene monomers are selected from the group consisting of vinylanisole, o-aminostyrene, m-aminostyrene, p-aminostyrene, 4-fluorostyrene, 3-fluorostyrene, and vinyldimethoxybenzene.

7. The method of claim 1 wherein the B-staged thermoset dielectric matrix material has a molecular weight of greater than 35,000 and wherein the porogen comprises N-vinylpyrrolidone as polymerized units in an amount of at least 20%, based on the total weight of the monomers and cross-linker.

8. The method of claim 1 wherein the B-staged thermoset dielectric matrix material is benzocyclobutene and wherein the porogen comprises vinylanisole as polymerized units.

* * * * *